United States Patent [19]

Stikvoort et al.

[11] Patent Number: 4,692,737
[45] Date of Patent: Sep. 8, 1987

[54] ENCODING DEVICE

[75] Inventors: Eduard F. Stikvoort; Arthur H. M. van Roermund; Peter J. A. Naus, all of Eindhoven, Netherlands

[73] Assignee: U.S. Philips Corporation, New York, N.Y.

[21] Appl. No.: 920,490

[22] Filed: Oct. 17, 1986

[30] Foreign Application Priority Data

Apr. 4, 1986 [NL] Netherlands ......................... 8600862

[51] Int. Cl.[4] ............................................. H03M 1/00
[52] U.S. Cl. ...................... 340/347 DD; 340/347 AD; 340/347 DA; 375/34
[58] Field of Search ................ 340/347 AD, 347 DA, 340/347 DD; 375/28-34; 364/724

[56] References Cited

U.S. PATENT DOCUMENTS

3,793,513 2/1974 Kameko ...................... 340/347 DD
4,035,724 7/1977 Stepaenne ...................... 340/347 DD

*Primary Examiner*—Charles D. Miller
*Attorney, Agent, or Firm*—Thomas A. Briody; William J. Streeter; Gregory P. Gadson

[57] ABSTRACT

A time-discrete amplitude-continuous or a time-discrete amplitude-discrete signal is converted in to a 1-bit encoded signal by means of a quantizer, the quantization-error signal being fed back via a loop filter. The transfer function of the loop filter is given by $H(Z)=1-(Z-b)^n/(Z-a)^n$, where $n \geq 3$, $b \approx 1$ and $0 < a < b$. In order to preclude, the input signal of the loop filter is limited by a limiter.

14 Claims, 24 Drawing Figures

| P d c b a | $P_D$ | Y | V' $d_o\ c_o\ b_o\ a_o$ | $V_D'$ | V $d_o\ c_o\ b_o\ a_o$ | $V_D$ | R |
|---|---|---|---|---|---|---|---|
| 0 0 0 0 | 0 | 1 | 1 1 1 1 | −1 | 1 1 1 1 | −1 | 0 |
| 0 0 0 1 | 1 | 1 | 0 0 0 0 | 0 | 0 0 0 0 | 0 | 0 |
| 0 0 1 0 | 2 | 1 | 0 0 0 1 | 1 | 0 0 0 1 | 1 | 0 |
| 0 0 1 1 | 3 | 1 | 0 0 1 0 | 2 | 0 0 1 0 | 2 | 1 |
| 0 1 0 0 | 4 | 1 | 0 0 1 1 | 3 | 0 0 1 0 | 2 | 1 |
| 0 1 0 1 | 5 | 1 | 0 1 0 0 | 4 | 0 0 1 0 | 2 | 1 |
| 0 1 1 0 | 6 | 1 | 0 1 0 1 | 5 | 0 0 1 0 | 2 | 1 |
| 0 1 1 1 | 7 | 1 | 0 1 1 0 | 6 | 0 0 1 0 | 2 | 1 |
| 1 0 0 0 | −8 | 0 | 1 0 0 1 | −7 | 1 1 1 0 | −2 | 1 |
| 1 0 0 1 | −7 | 0 | 1 0 1 0 | −6 | 1 1 1 0 | −2 | 1 |
| 1 0 1 0 | −6 | 0 | 1 0 1 1 | −5 | 1 1 1 0 | −2 | 1 |
| 1 0 1 1 | −5 | 0 | 1 1 0 0 | −4 | 1 1 1 0 | −2 | 1 |
| 1 1 0 0 | −4 | 0 | 1 1 0 1 | −3 | 1 1 1 0 | −2 | 1 |
| 1 1 0 1 | −3 | 0 | 1 1 1 0 | −2 | 1 1 1 0 | −2 | 0 |
| 1 1 1 0 | −2 | 0 | 1 1 1 1 | −1 | 1 1 1 1 | −1 | 0 |
| 1 1 1 1 | −1 | 0 | 0 0 0 0 | 0 | 0 0 0 0 | 0 | 0 |

ENCODING DEVICE

BACKGROUND OF THE INVENTION

The invention relates to an encoding device comprising a quantizer for converting an input signal into a one-bit encoded signal, which quantizer comprises an input for receiving the input signal and an output for supplying the one-bit encoded signal, and further comprising error-feedback means for feeding back to the quantizer input a quantization-error signal caused by the quantizer, which error-feedback means comprise an at least third-order filter having an input and an output.

Such a device is suitable for use in analog-to-digital and digital-to-analog converters.

In analog-to-digital conversion the bandwidth of the analog signal is usually limited to substantially half the sampling frequency by means of an analog low-pass filter, after which sampling and quantization is effected. In this way an analog audio signal, for example with a frequency of 44.1 kHz, can be sampled and can subsequently be converted into a 16-bit pulse-code-modulated signal.

Such an analog-to-digital conversion imposes very stringent requirements on the analog input filter in view of the required frequency roll-off above the signal band and on the quantizer in view of the accuracy required for 16-bit quantization. In order to enable less stringent requirements to be imposed on the input filter in analog-to-digital converters, it is known to convert the input signal by means of a 1-bit quantizer into a 1-bit signal having a sampling frequency which is substantially higher than approximately twice the highest signal frequency. By means of a decimating filter this 1-bit signal can subsequently be converted into, for example, a 16-bit pulse-code modulated signal having a lower sampling frequency. The decimating filter comprises a digital low-pass filter followed by a down-sampler. The low-pass filter is then required to have a steep roll-off above the signal band, which is easier to realize for a digital filter than for an analog filter. The 1-bit encoding device may then be a device in which the quantization error produced by the quantizer is substracted from the input signal via a loop filter before this signal is applied to the quantizer. If the transfer function of this loop filter is substantially unity within the signal band and rolls off steeply above this band, this ensures that the quantization noise, corresponding to the quantization errors, in the 1-bit encoded signal within the signal band is attenuated at the expense of an increase in quantization noise outside the signal band.

A similar encoding device may also be employed in a digital-to-analog converter in which, for example, a 16-bit pulse-code-modulated signal with a sampling frequency of 44.1 kHz is first converted into a 28-bit encoded signal with a sampling frequency of 176.4 kHz by means of an interpolating filter and is subsequently re-converted into a 1-bit signal by means of the encoding device, the quantization error being substracted from the input signal via a loop filter. Again, this results in a reduction of the quantization noise in the 1-bit signal within the signal band at the expense of an increase of this noise above the signal band. Subsequently, the 1-bit output signal is applied to the actual 1-bit digital-to-analog converter, which can be realized in a comparatively simple manner.

An encoding device of the type defined in the opening paragraph is known from German Patent Specification No. 3,021,021, in which the device is employed in order to reduce the quantization noise in a digital-to-analog converter in a way similar to that described above. Said Patent Specification also states that the reduction of quantization-noise within the signal band increases as the order of the loop filter is higher. The loop filter described in said Patent Specification have a transfer function given by $1-H(Z)=(Z-b)^n/Z^n$, where n is the order of the loop filter and b is a constant which is substantially equal to unity. Such loop filters provide a satisfactory reduction of quantization noise within the signal band, but this known encoding device has the disadvantage that it exhibits instabilities for loop filters of orders higher than the second order.

SUMMARY OF THE INVENTION

Therefore, it is the object of the present invention to provide an encoding device which does not exhibit instabilities for such higher-order loop filters. In accordance with the invention an encoding device of a type defined in the opening paragraph is characterized in that the transfer function of the filter is given by $$H_n(Z) = 1 - (Z-b)^n/(Z-a)^n$$

where:
$n \geq 3$ is the order of the filter
b is a constant substantially equal to unity, and
a is a constant for which $0 < a < b$,
and in that the device comprises limiting means for limiting the quantization-error signal applied to the input of the filter. The use of a filter of at least the third order for which the constant b is substantially equal to unity results in a better reduction of the quantization noise within the signal band, while the occurrence of instabilities is precluded by the addition to the transfer function of those roots in $Z = a$, of which the real roots are positive, and by the addition of a limiter.

The value of the constant a depends on the filter order. For a third-order filter (n=3) the constant a has a value within the interval $0.35 < a < b$ and in a suitable embodiment it is substantially equal to $a = 0.5$. For a fourth-order filter (n=4) the constant a has a value within the interval $0.6 < a < b$ and is suitably substantially equal to $a = 0.66$.

The input signal of the encoding device may be both a discrete-time amplitude-continuous signal and a digital signal.

An embodiment of the invention may be characterized in that the device further comprises
a first summing circuit having a first input for receiving the input signal, a second input for receiving the output signal of the filter and an output for supplying the sum signal of said two signals to the input of the quantizer,
a second summing circuit having a first input for receiving the output signal of the quantizer, a second input for receiving the output signal of the first summing circuit and an output for supplying the difference between these two signals to the input of the filter, and
in that the limiting means are arranged between the output of the first summing circuit and the input of the filter in a first loop comprising the first summing circuit, the second summing circuit and the filter.

For a discrete-time amplitude-continuous input signal this embodiment may be characterized further
in that in the first loop comprising the first summing circuit, the second summing circuit and the filter, a first delay means is arranged between the output of the first summing circuit and the first input of the second summing circuit, for delaying the output signal of the first summing circuit by one clock period of the quantizer, in that in the second loop comprising the first summing circuit, the quantizer and the filter, a second delay means is arranged between the output of the first summing circuit and the second input of the second summing circuit, which second delay means has the same delay time as a first delay means, in that the first summing means has a third input for receiving the output signal of the first summing circuit delayed by one clock period, in that the first summing circuit has a fourth input for receiving the output signal of the quantizer delayed by one clock period, and in that the transfer function of the filter is given by $ZH(Z) - 1$.

A further embodiment, which can be realized by means of switched capacitors, may be characterized in that in the first loop the first delay means comprises a third delay means for delaying the output signal of the first summing circuit by half a clock period between the output of the first summing means and the input of the quantizer and a fourth delay means for delaying the output signal of the summing circuit by half a clock period between the input of the quantizer and the first input of the second summing circuit, in that in the second loop the second delay means comprises the third delay means and a fifth delay means for delaying the output signal of the quantizer by half a clock period between the output of the quantizer and the second input of the second summing circuit, and in that between the output of the third delay means and the third input of the first summing circuit a sixth delay means is arranged for delaying the output signal of the third delay means by half a clock period. Suitably, such a device comprising switched-capacitors may be charcterized in that the loop comprising the first summing circuit, the third delay means and the sixth delay means forms a switched-capacitor integrator, the signals on the first input, the second input and the fourth input of the first summing circuit being sampled in a first half of a clock period and the output signal of the integrator being supplied to an output of the integrator in a second half of a clock period, the output signal of the quantizer is supplied to the output of the quantizer in a secnd half of a clock period, the fourth delay means comprises a first switch for connecting the output of the integrator to a first input of the filter in a first clock period, the fifth delay means comprises a second switch for connecting the output of the quantizer to a second input of the filter in a first clock period, and the filter is a switched-capacitor filter comprising an input stage which processes the sum of the signals on the first input and the second input of the filter.

An embodiment which is suitable for digital input signals may be characterized in that the device comprises a first summing circuit having an n-bit first input for receiving an n-bit input signal, an m-bit second input for receiving the m-bit output signal of the filter and a k+l-bit output for supplying the k+l-bit sum signal of the signals, means for supplying the most significant bit of the sum signal to the input of the quantizer, means for supplying the k least significant bits to the k+1-bit input of the filter, and means for supplying the l most significant bits of the sum signal to a 1-bit input of a logic circuit device having an l-bit output for supplying the l-bit difference signal of the l-bit input signal and the quantizer output signal expressed in l-bits to the k+l-bit input of the filter.

DESCRIPTION OF THE DRAWING

Embodiments of the invention will now be described in more detail, by way of example, with reference to the accompanying drawings, in which.

DETAILED DESCRIPTION

Figure 1:
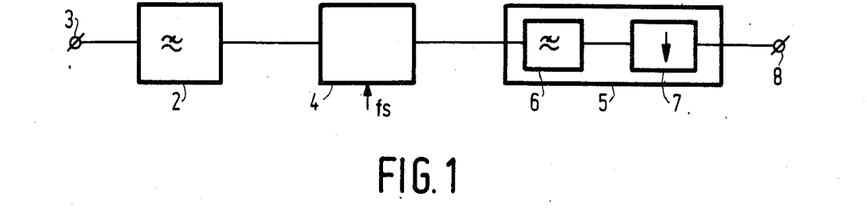
FIG. 1 shows the basic diagram of an analog-to-digital converter comprising a 1-bit encoding device

FIG. 1 shows the basic diagram of an analog-to-digital converter 1 in which an encoding device in accordance with the invention may be used. The converter 1 comprises an analog input filter 2 having an input 3 for receiving an analog input signal. This input signal is, for example, an audio signal. The output signal of the filter 2 is applied to a 1-bit encoding device 4 which converts this signal into a 1-bit encoded signal having a sampling frequency $f_s$ which is comparatively high relative to the maximum signal frequency. For audio signals this sampling frequency is, for example, 5.6 MHz. As a result of this comparatively high sampling frequency the input filter 2 may exhibit a comparatively low-order roll-off above the signal band, so that the filter 2 is comparatively simple to realize. Subsequently, the 1-bit encoded signal can be converted into a multi-bit encoded signal with a low sampling frequency by means of a decimating filter 5. For audio signals it may be converted into, for example, a 16-bit pulse-code-modulated signal having a sampling frequency of 44.1 kHz. The decimating filter then comprises a digital filter 6 with a steep roll-off above the signal band and a down-sampler 7 for reducing the sampling frequency, the filter having an output 8 for supplying the output signal.

Figure 2:
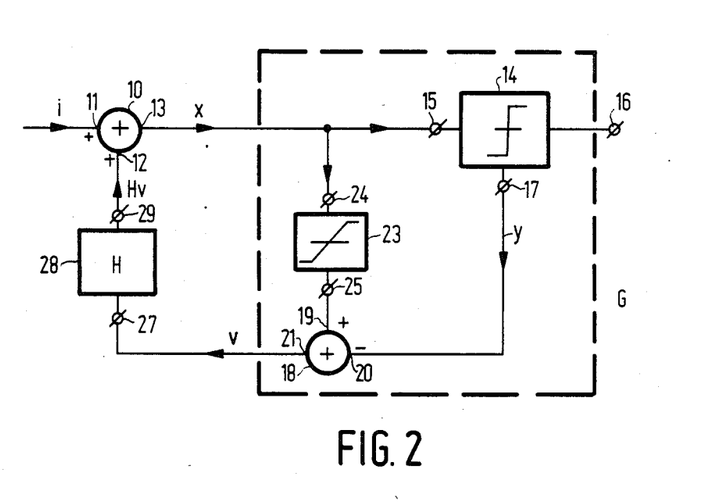
FIG. 2 shows a basic diagram of a 1-bit encoding device in accordance with the invention.

FIG. 2 shows the diagram of a 1-bit encoding device in accordance with the invention, suitable for use in the analog-to-digital converter shown in FIG. 1. The device comprises a summation circuit 10 having a first input 11 to which a discrete-time amplitude-continuous input signal i is applied, a second input 12 to which a feedback signal Hv is applied, and an output 13 to which the sum x of these signals is supplied. This signal x is applied to the input 15 of a quantizer 14, which converts this signal into a 1-bit encoded signal available on the output 16. The quantizer 14 may comprise a logic comparator circuit which is clocked with a clock frequency $f_s$ and which in every clock period compares the input signal x with a reference signal of, for example, zero volts to supply a first output signal corresponding to for example a logic "0" for positive input signals and a second output signal corresponding to a logic "1" for a negative input signals. This results in a bit stream of 1-bit words having a bit frequency $f_s$ on the output 16. The quantizer 14 further has a second output 17 on which the 1-bit encoded signal appears in the form of a discrete-time signal of a very low distortion.

Figure 3:
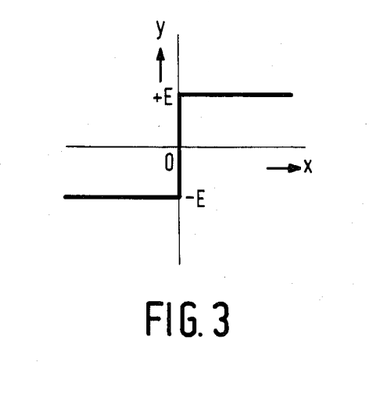
FIG. 3 represents the output signal as a function of the input signal of the quantizer used in the device shown in FIG. 2.

FIG. 3 shows the output signal y on the output 17 as a function of the input signal x. For input signals $x>0$ the output signal is $y=+E$ for input signals $x<0$ the output signal is $y=-E$.

Figure 4:
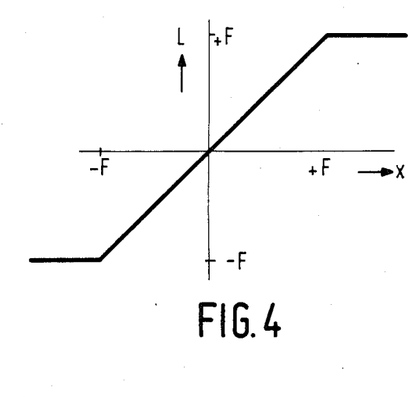
FIG. 4 represents the output signal as a function of the input signal of the limiter used in the device shown in FIG. 2.

Further, the signal x is applied to the input 24 of a limiter circuit 23 having an output 25. FIG. 4 shows the output signal L as a function of the input signal x. For input signals $-F \leq x \leq +F$ the limiter circuit has a transfer function equal to unity. For inputs signals $x > +F$ the output signal is limited to a value $L=+F$, while for input signals $x < -F$ the output voltage is limited to a value $L=-F$.

The output signal y of the quantizer 14 is applied to a first input 20 and the output signal L of the limiter 23 is applied to a second input 19 of a substractor 18, which produces the difference v between these signals on its output 21 and applies this difference to the input 27 of an at least 3rd-order loop filter 28, whose output 29 supplies the feedback signal Hv to the second input 12 of the summing circuit 10.

By means of the above device, the input signal i is converted into a 1-bit encoded signal with the aid of the quantizer 14, the quantization errors which are caused by the quantizer 14 and which are equal to the differences between the input signal and the output signal of the quantizer 14 being fed back to the input 15 of the quantizer 14 via the loop filter 28. As is known, the quantization errors may be regarded as white noise which is added to the input signal. The loop filter 28 has such a transfer characteristic that this noise within the signal band is reduced at the expense of an increase in noise outside this signal band, which last-mentioned noise can be removed by filtering the output signal of the encoding device. The limiter circuit 23 in combination with the special transfer function of the loop filter 28 then ensures that the encoding device does not exhibit any instabilities.

For the output signal y of the quantizer 14 the following approximation is valid for input signals x within the linear range of the limiter 23:

$$y = Cx + r \qquad (1)$$

where C is a factor which is substantially equal to the gain which the quantizer has for the input signal x in the feedback loop between the output 17 and the input 15 of the quantizer, and where r is the quantization error caused by the quantizer 14. In a frequency-domain representation (Z-transform) this equation is written as:

$$Y = CX + R \qquad (2)$$

Here, R represents the power density distribution of the quantization error. Further, the following equations apply to the output signals v and x of the subtractor 18 and the summing circuit 10:

$$V = X - Y \qquad (3)$$

By solving X and V in the above equations 2, 3 and 4 it follows for the relationship between the output signal Y and the input signal I that:

$$Y = \frac{C}{1-H+CH} \cdot I + \frac{1-H}{1-H+CH} \cdot R \qquad (5)$$

If the noise within the signal band should be minimised the factor $|1-H|$ for frequencies within the signal band must be minimal. For a factor $|1-H|$ which is small relative to unity equation (5) may be approximated by $$Y = I + \frac{1-H}{C} \cdot R \qquad (6)$$

This equation shows that the output signal of the quantizer 14 is formed by the undistorted input signal I and the noise which is irregularly distributed over the frequency band by the loop filter 28.

In accordance with the invention the loop filter 28 has a transfer function given by:

$$1 - H(Z) = \frac{(Z-b)^n}{(Z-a)^n} \qquad (7)$$

where $n \geq 3$ and $0 < a < b < 1$. The constant b is approximately equal to unity and is suitably selected to equal unity. In this last-mentioned case the term $|1-H|$ has an $n^{th}$-order zero point for $Z=1$, i.e. for zero frequency, which results in an $n^{th}$-order rejection of the quantization noise within the signal band. A further advantage of the value $b=1$ is that the annoying effects then usually occurring as a result of the d.c. off-set on the input of the quantizer 14 are avoided. The choice of $b=1$ results in a higher-order integration of the error occurring at very low frequencies. This precludes the occurrence of recurrent patterns in the quantizer output as a result of, for example, offset.

Figure 5:
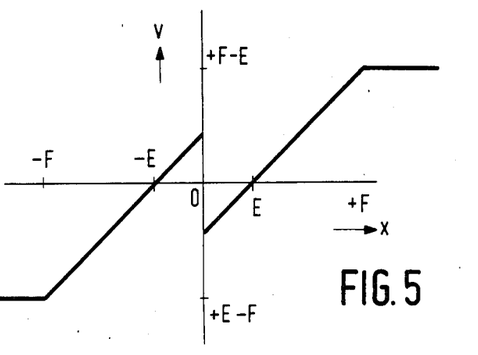
FIG. 5 represents the output signal as a function of the input signal of the non-linear section in FIG. 2.
Figure 6:
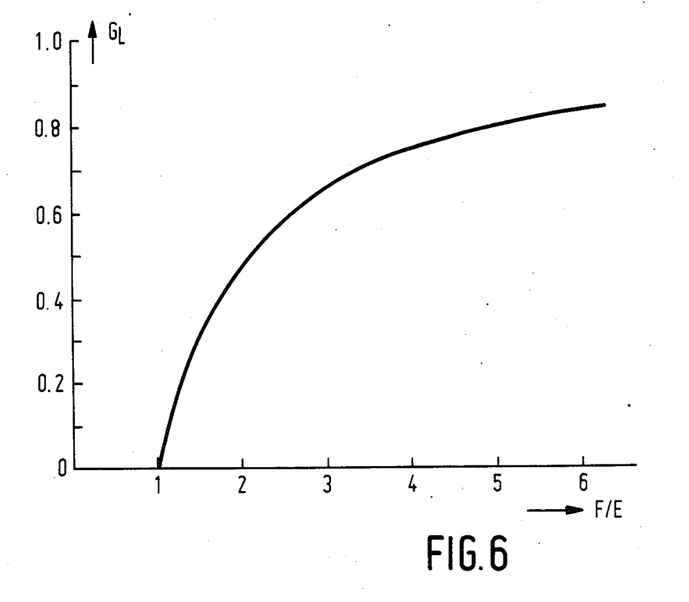
FIG. 6 represents the maximum transfer of the non-linear section as a function of the ratio between the maximum output signal of the limiter and the output signal of the quantizer of FIG. 2 for a squarewave input signal.

Before discussing the noise characteristics, the stability of the encoding device in accordance with the invention will be considered in more detail, which device comprises a loop filter 28 having a transfer function given by equation (7). The stability is examined by means of the root-locus method. For this purpose the encoding device is divided into a linear section comprising the quantizer 14, the limiter 23 and the summing circuit 18 with a transfer function G (see FIG. 2). FIG. 5 illustrates the relationship between the output signal v and the input signal x of the non-linear section, which can be derived simply from FIGS. 3 and 4. From these Figures it is evident that the transfer function G of the non-linear section depends on the magnitude of the input signal x and that the transfer function $G \leq 1$. The maximum value $G_L$ of the transfer function depends on the ratio between the value F to which the input signal x is limited by the limiter 23 and the quantization value E of the quantizer 14 and on the waveform of the signal x. FIG. 6 illustrates this dependence for a squarewave input signal. The encoding device is stable if the roots of the characteristic equation $GH(Z)=1$ are situated within the unit circle $|Z| \leq |$ for every possible value of G. The root loci of this equation for filters defined by equation (7) are circles having centres $(x_o, jy_o)$ and a radius $R_o$ given by $$x_o = (a+b)/2;\ y_o = \frac{b-a}{2} \cos \phi;\ R_o = \frac{b-a}{2 \sin \phi} \quad (8)$$

where $\phi = k\pi/n$ with $k=0, 1, \ldots n-1$ and $n \geq 3$.

Figure 7:
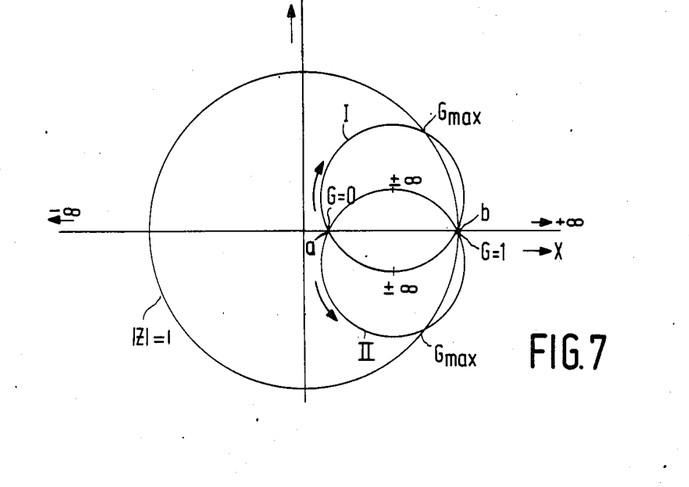
FIGS. 7-11 are Figures illustrating the operation of a device of FIG. 2 provided with a 3rd-order loop filter.

FIG. 7 shows the root loci for a 3rd-order loop filter 28 (n=3), for which b=1. The root locus for $\phi=0$ is given by the real axis, while the root loci for $\phi=\pi/3$ and $\phi=2\pi/3$ are given by the circles I and II respectively. For each of the circles I and II the value G=1 corresponds to Z=1 and the value of G=0 corresponds to Z=a, which readily follows from equation (7) and the characteristic equation. The arrows near the circles indicate the direction in which G increases from 0 to 1 along the circle. The circles I and II intersect the unit circle $|Z|=1$ in a point $G=G_{max}$. For the values $G_{max} < G < 1$ the roots of the characteristic equation are situated outside the unit circle, so that the encoding device is not stable for these G-values. The stability requirement for an encoding device comprising a third-ord order loop filter is therefore given by:

$$G_L \geq G_{max} \quad (9)$$

Figure 8:
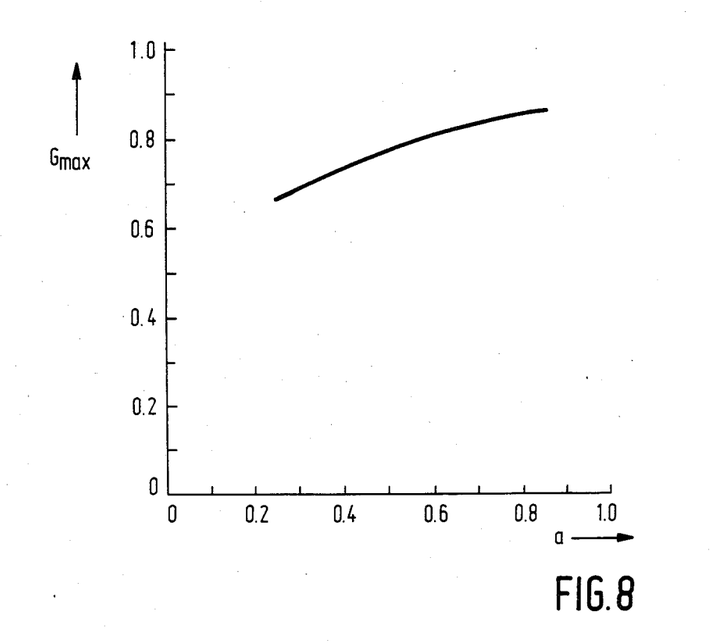

From equation (8) it follows that for b=1 the radii of the circles I and II depend on the value of the constant a, so that the value of $G_{max}$ also depends on the value of this constant. This dependence is illustrated in FIG. 8. The value of $G_{max}$ corresponding to a specific value of a defines the ratio F/E (see FIG. 6). In other words: for a given quantisation step size E the value of a dictates the value F to which the limiter 23 (see FIG. 1) is required to limit the input signal x in the feedback loop in order to ensure that the encoding device remains stable.

The value of the factor a also follows from the requirement that the quantization noise within the signal band should be small. The overall noise power added to the output signal of the encoding device by the quantizer is, as is known, equal to $E^2/3$ for a quantization step 2E. The noise power within the signal band is then equal to $$N_i = \int_0^{\theta b} \frac{E^2}{3\pi} \left| \frac{1-H(\theta)}{1-H(\theta)+CH(\theta)} \right|^2 d\theta \quad (10)$$

where $\theta$ is the normalized angular frequency, i.e. $\theta = 2\pi f/fs$, where fs is the sampling frequency and $\theta b$ is the highest normalized angular frequency of the signal.

For a sampling frequency fs which is substantially higher than the highest signal frequency, i.e. for $\theta b << 1$, equation (10) for filters having a transfer function in accordance with equation (7) for which b=1 may be approximated by:

$$N_i = \frac{E^2}{3\pi} \cdot \frac{\theta_b^{2n+1}}{C^2(1-a)^{2n}(2n+1)} \quad (11)$$

where n is the order of the loop filter.

The factor C follows from the fact that for an input signal equal to zero the output power of the encoding device is equal to the noise power in the entire frequency band, or:

$$\bar{y}^2 = \int_0^\pi \frac{E^2}{3\pi} \left| \frac{1-H(\theta)}{1-H(\theta)+CH(\theta)} \right|^2 d\theta \quad (12)$$

Since the output signal of the encoding device can only be $\pm E$, equation (12) may be reduced to:

$$\int_0^\pi \left| \frac{1-H(\theta)}{1-H(\theta)+CH(\theta)} \right|^2 d\theta = 3\pi \quad (13)$$

Figure 9:
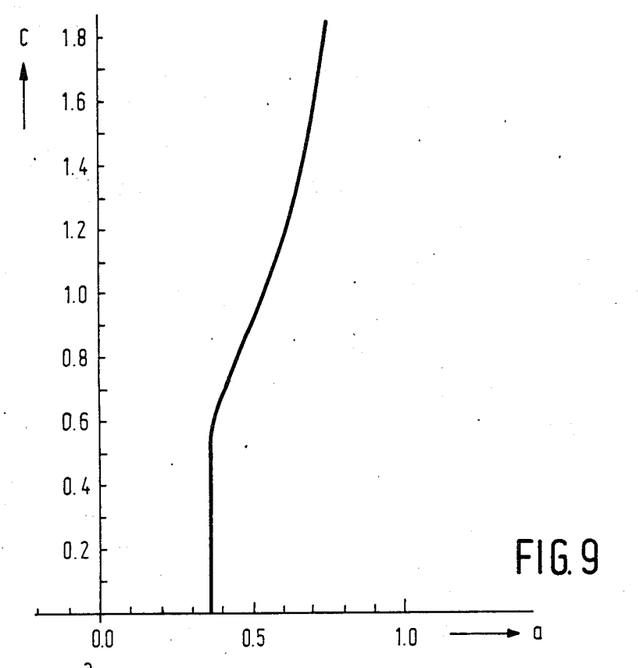

From this integral equation it is possible to compute the value of C for each value of a for a loop filter in conformity with equation (7) for which b=1. FIG. 9 shows the value of the factor C thus calculated as a function of the value of the factor a for a third-order loop filter.

Figure 10:
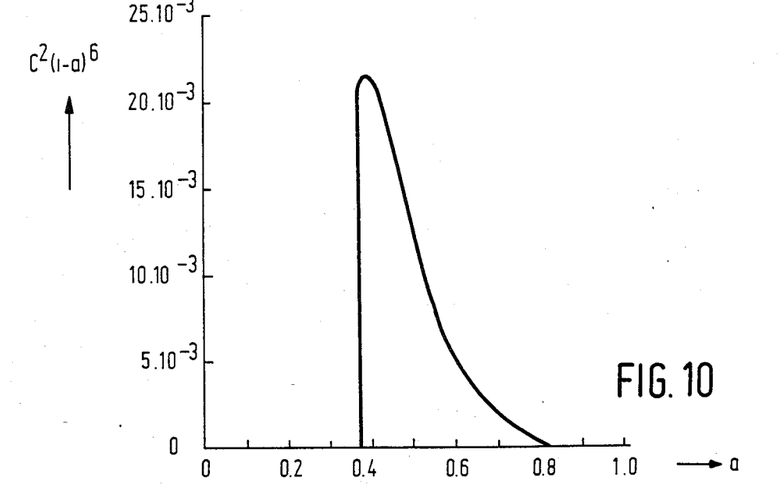

It follows from equation (11) that for a given order n of the loop filter and a given sampling frequency fs i.e. a given $\theta b$, the noise power $N_i$ within the signal band is minimal if the factor $C^2(1-a)^{2n}$ is maximal. FIG. 10 represents this factor as a function of the value of a for a 3rd-order loop filter (n=3). It follows from this figure that the factor $C^2(1-a)^6$ is a maximum for $a \approx 0.4$. In practice, it is found that it is not necessary to select the exact optimum value, but that values which differ from this optimum value are also satisfactory. For example, this value may be selected to be equal to a=0.5. For a specific selected value of a it is subsequently possible to find the ratio F/E by means of FIGS. 8 and 6 and thus the maximum value of F to which the limiter 23 should limit the input signal x for a given quantization step E. For a 3rd-order loop filter for which b=1 and a=0.5 it is found that F/E=4 is a suitable value.

Figure 11:
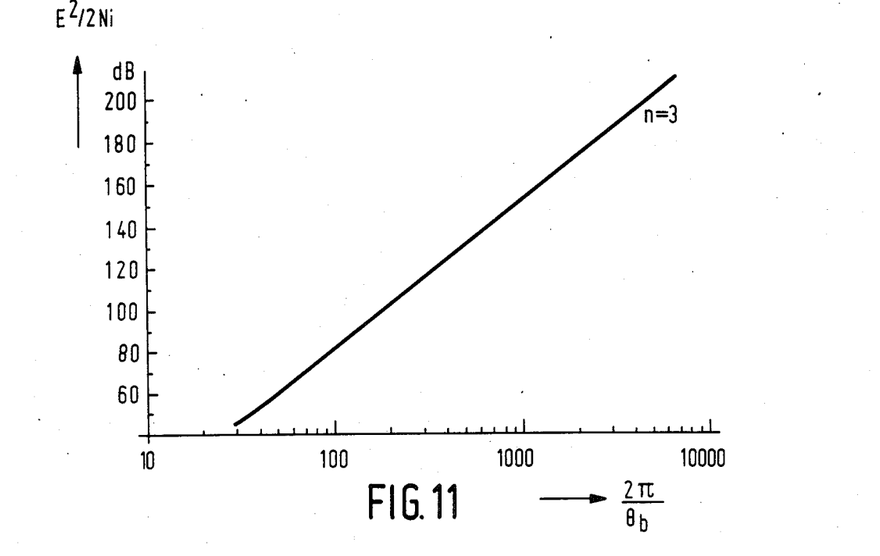

Further, it follows from equation (11) that for a given order n of the loop filter the noise power within the signal band decreases as the maximum normalized signal frequency decreases or that it decreases as the sampling frequency increases. In FIG. 11 the ratio between the maximum signal power Sm equal to $E^2/2$ and the noise power $N_i$ as a function of the oversampling factor $2\pi/\theta_b = fs/fb$ is plotted for a 3rd-order loop filter for which b=1 and for an optimum value of a. Starting from the desired dynamic range $Sm/N_i$ FIG. 11 may provide an indication of the sampling frequency required to achieve this.

Figure 12:
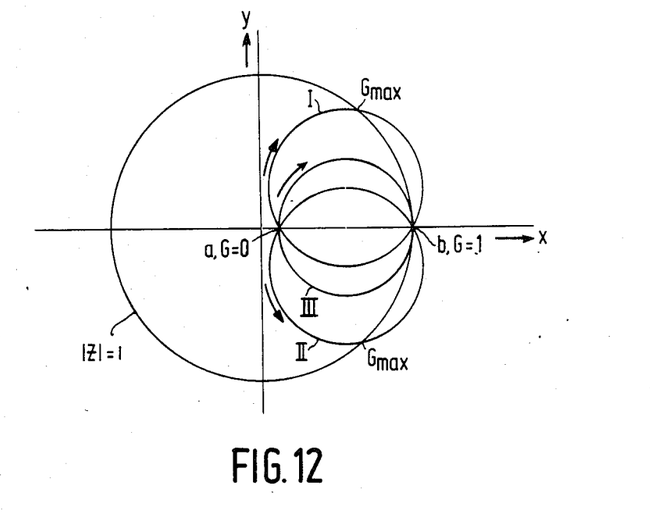
FIGS. 12-14 are Figures illustrating the operation of the device of FIG. 2 provided with a 4th-order loop filter.
Figure 13:
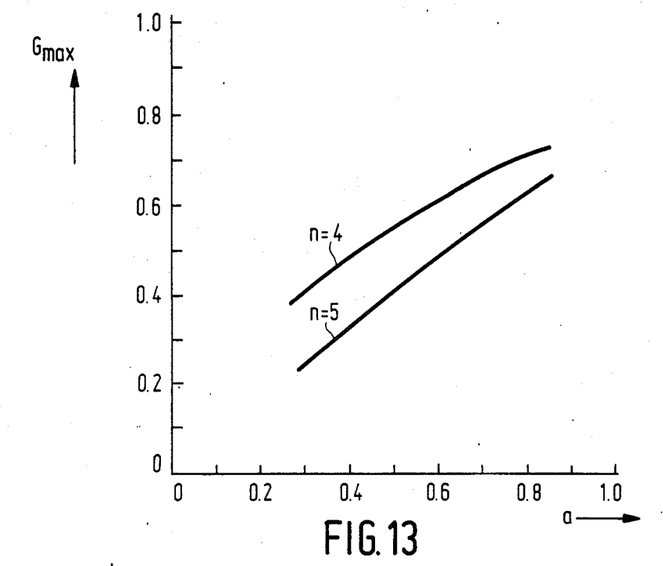
Figure 14:
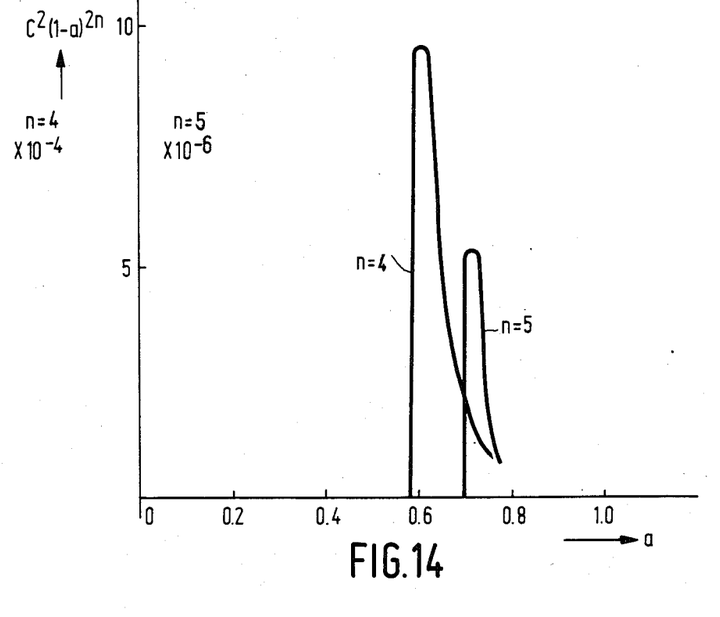

In the same way as derived in the foregoing for a 3rd-order loop filter, it is possible to derive the values of the factor a in the transfer function H(Z) for higher-order loop filters for which the encoding device is stable. The stability requirement for a 4th-order loop filter for which the transfer function is given by $$H(Z) = 1 - \frac{(Z-1)^4}{(Z-a)^4} \quad (14)$$

will be explained with reference to FIGS. 12 to 14. FIG. 12 gives the root loci for this 14th-order loop filter, which loci are defined by equation (8) with $n=4$. The root locus for $\phi=0$ is again given by the real axis, whilst the root loci for $\phi=\pi/4$, $\pi/2$ and $3\pi/4$ are given by the circles I, II and III respectively. For a stable encoding device the maximum transfer of the non-linear section is again required to be $G_L \leq G_{max}$ (see equation (9)). FIG. 13 illustrates the dependence of $G_{max}$ on the value of a. The value of a is again dictated by the requirement that the noise power within the signal band must be substantially minimal. In conformity with equation (11) the factor $C^2(1-a)^8$ must be substantially maximal. FIG. 14 illustrates the relationship between this factor and the value of the factor a. From this Figure a suitable value for a may be selected. The value of F to which the limiter 23 should limit the input signal of the loop filter 28 for this value of a can then be derived by means of FIG. 13 and FIG. 6.

FIG. 14 also gives the relevant data for a 5th-order loop filter.

Figure 15A:
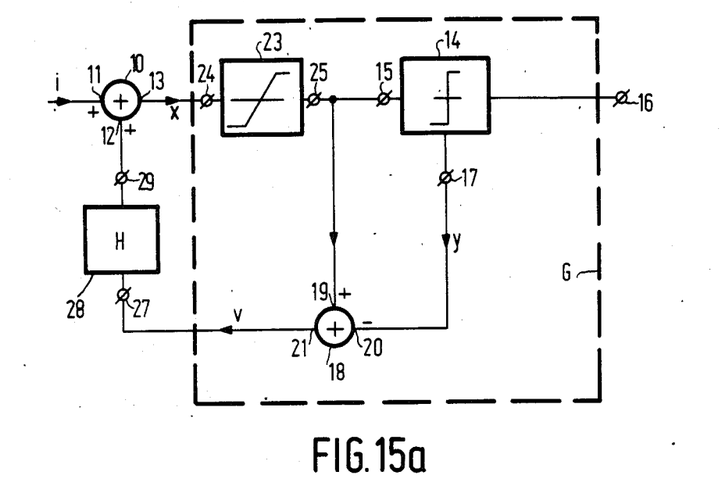
FIGS. 15a and 15b show two modifications of the device shown in FIG. 2.
Figure 15B:
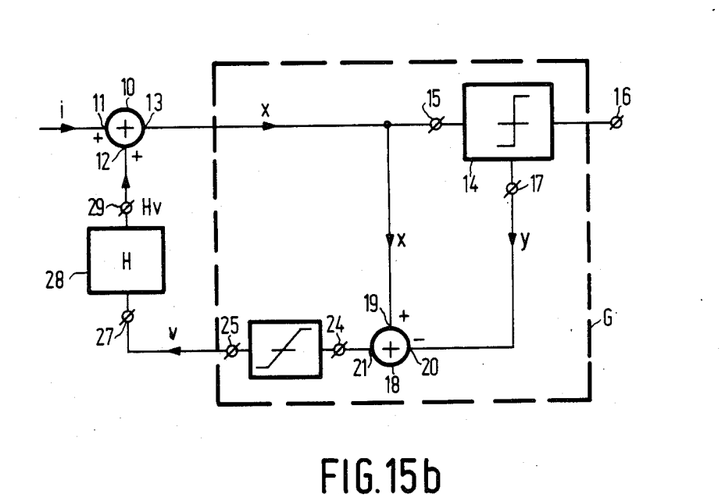

FIG. 15 shows two modifications of the circuit shown in FIG. 2, in which identical parts bear the same reference numerals. In FIG. 2 the limiter 23 is arranged between the input 15 of the quantizer 14 and the input 27 of the loop filter 28. The limiter 23 limits the maximum value of the input signal v of the loop filter 8. The same limiting function is obtained if the limiter 23 is arranged between the output 13 of the summing circuit 10 and the input 15 of the quantizer 14, as is shown in FIG. 15a, or between the output 27 of the subtractor 18 and the input 27 of the loop filter 28, as is shown in FIG. 15b. In the latter case the limiter 23 should limit the input signal of the filter 28 to a value $F'=F-E$.

Figure 16:
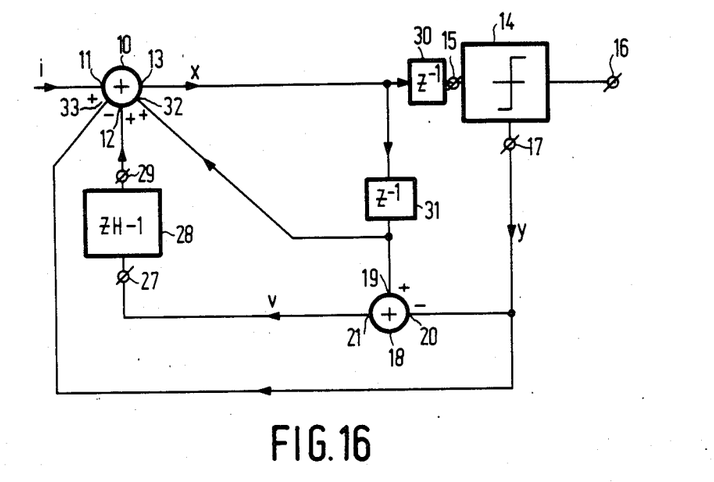
FIG. 16 shows a modification of the device shown in FIG. 15a, FIG. 17 shows a further modification of the device shown in FIG. 16.

An embodiment based on the diagram of FIG. 15a will now be described in more detail with reference to FIGS. 16, 17 and 18. FIG. 16 shows a modification of the diagram of FIG. 15a, the limiter 23 not being shown for a reason to be explained hereinafter. In the present embodiment both the signal y applied to the input 19 of the subtractor 18 and the signal x applied to the input 19 of the subtractor are delayed by a factor $Z^{-1}$ by the delay means 30 and 31, respectively. In order to compensate for these delays the transfer function H of the loop filter 28 is multiplied by a factor Z. In addition, the signal x delayed by the delay means 31 is added directly to the input signal by applying this signal to an input 32 of the summing circuit 10 and the signal delayed by the delay means 30 is subtracted directly from the input signal by applying this signal to an input 33 of the summing circuit. In order to compensate for these signals the transfer function of the loop filter 28 is extended by a factor $-1$, so that the transfer function is now $T=ZH-1$. This modification has the advantage that the loop comprising the summing circuit 10 and the delay means 31 constitutes an integrator which is simple to realize in switched-capacitor technology. This integrator then also enables the limiting function of the limiter 23 (see FIG. 12a) to be realized simply.

Figure 17:
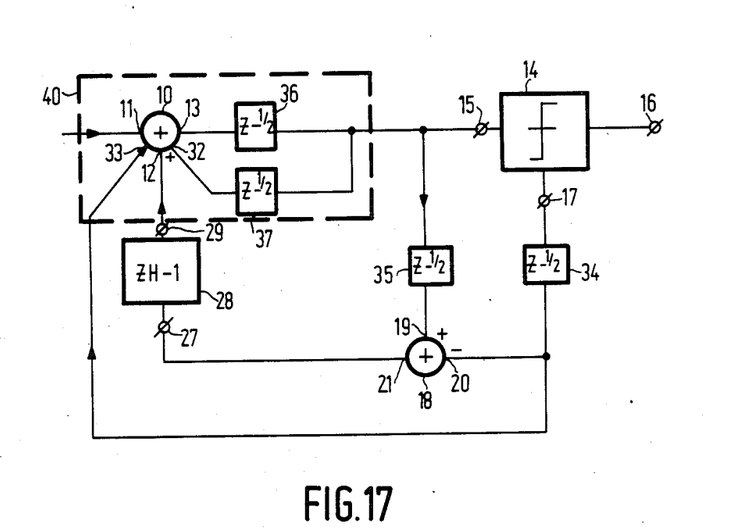

In FIG. 17 the diagram of FIG. 16 has been converted into a diagram which is suitable for the use of switched capacitors. The delay means 30 and 31 with a delay $Z^{-1}$ are each split into two delay means 34, 36 and 35, 36 respectively each having a delay $Z^{-\frac{1}{2}}$, the delay means 36 being common to the delay means for the X signal and for the Y signal. The X signal delayed by $Z^{-\frac{1}{2}}$ by the delay means 36 is fed back to the input 32 of the summing circuit 10 via a delay means 37 with a delay $Z^{-\frac{1}{2}}$ in order to obtain an overall delay $Z^{-1}$ for this signal.

Figure 18:
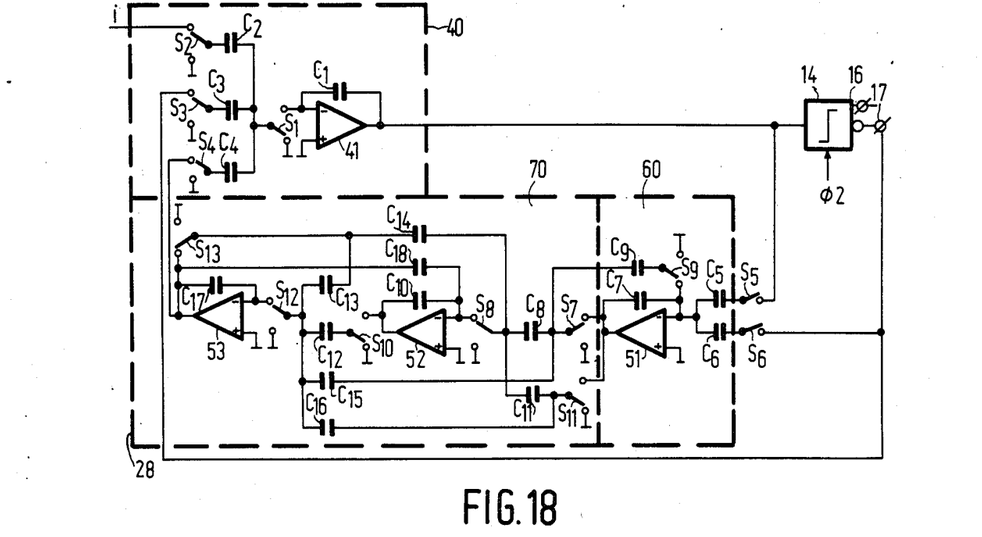
FIG. 18 shows a switched-capacitor version of the device shown in FIG. 17.

FIG. 18 shows a switched-capacitor version of the encoding device which comprises a 3rd-order loop filter and is based on the diagram shown in FIG. 17.

The section bearing the reference numeral 40 in FIG. 17 constitutes a switched-capacitor integrator. This integrator 40 comprises a capacitor $C_2$ having one terminal which can be connected to earth or to the input for the input signal I via a switch $S_2$, a capacitor $C_3$ having one terminal which can be connected to earth or to the output 17 of the quantizer 14 via a switch $S_3$, and a capacitor $C_4$ having one terminal which can be connected to earth or to the output of the filter 28 via a switch $S_4$. The other terminals of the capacitors $C_2$, $C_3$ and $C_4$ can be connected to earth or to the inverting input of an amplifier 41 via a switch $S_1$, the non-inverting input of this amplifier being connected to earth and the output of this amplifier being connected to its inverting input via a capacitor $C_1$.

The filter 28 comprises an amplifier 51 having a non-inverting input which is connected to earth and an inverting input which is connected to one terminal of a capacitor $C_5$ whose other terminals can be connected to the output of the integrator 40 via a switch $S_5$, the inverting input being also connected to one terminal of a capacitor $C_6$ whose other terminal can be connected to the output of the quantizer 14 via a switch $S_6$. By controlling the switches $S_5$ and $S_6$ in a specific manner in the present circuit these switches constitute the delay means 35 and 34 of FIG. 17. The output of the amplifier 51 is connected to the inverting input via a capacitor $C_7$. The filter further comprises a capacitor $C_8$ of which one terminal can be connected to earth or to the output of the amplifier 51 via a switch $S_7$ and of which the other terminal can be connected to earth or to the inverting input of an amplifier 51 via a switch $S_8$, the non-inverting input of said amplifier 52 being connected to earth and the output being connected to the inverting input via a capacitor $C_{10}$. Further, said one terminal of the capacitor $C_8$ is connected to one terminal of a capacitor $C_9$ whose other terminal can be connected to earth or to the inverting input of the amplifier 51 via a switch $S_9$. The other terminal of the capacitor $C_8$ is further connected to one terminal of a capacitor $C_{11}$ whose other terminal can be connected to earth or to the output of the amplifier 51 via a switch $S_{11}$. The filter further comprises a capacitor $C_{12}$ having one terminal which can be connected to earth or to the output of the amplifier 52 via a switch $S_{10}$ and having another terminal which is connected to one terminal of the capacitor $C_{15}$ whose other terminal is connected to one terminal of the capacitor $C_8$, said other terminal of the capacitor $C_{12}$ being also connected to one terminal of a capacitor $C_{16}$ whose other terminal is connected to the other terminal of the capacitor $C_{11}$. Further, the other terminal of the capacitor $C_{12}$ can be connected to earth or to the inverting input of an amplifier 53 via a switch $S_{12}$, the non-inverting input of said amplifier 53 being connected to earth and the output being connected to the inverting input of the amplifier 53 via a capacitor $C_{17}$ and to the inverting input of the amplifier 52 via a capacitor $C_{18}$. Finally, the other terminal of the capacitor $C_8$ and the capacitor $C_{12}$ is connected to one terminal of a capacitor $C_{14}$ and a capacitor $C_{13}$ respectively, whose common other terminal can be connected to earth or to the input of the amplifier 53 via a switch $S_{13}$.

The switches $S_1$–$S_{14}$ are shown in the positions which they occupy during the clock phase $\phi_1$ of the clock signal by means of which the circuit is operated. During the clock phase $\phi_2$ of this clock signal the switches are in the other positions. The circuit operates as follows.

In the clock phase $\phi_1$ the capacitors $C_2$, $C_3$ and $C_4$ are charged to the input voltage i, the inverted output voltage y of the quantizer 14, and the output voltage of the filter 28 respectively. At the beginning of the next clock phase $\phi_2$ these capacitors $C_2$, $C_3$ and $C_4$ are discharged via the capacitor $C_1$, the voltage appearing on the output of the amplifier 41 being determined by said voltages and by the capacitance ratios between the capacitor $C_1$ and the capacitors $C_2$, $C_3$ and $C_4$. The voltage x on the output of the integrator is then delayed by half a clock period relative to the input voltage, which corresponds to a delay of $Z^{-\frac{1}{2}}$. In the same clock phase $\phi_2$ the quantizer 14 is clocked out, so that the output signal $-y$ is also delayed by half a clock period relative to the input voltage. It is to be noted that the voltage on the output 17 has already been inverted relative to that on the output 16, so that the voltage $-y$ appears on the output 17. In the next clock phase $\phi_1$ the switches $S_5$ and $S_6$ are closed, so that the voltages x and $-y$ are delayed by a full clock period relative to the input signal, corresponding to a delay $Z^{-1}$, and applied to the filter 28. As the capacitors $C_6$ and $C_5$ are both connected to the inverting input of amplifier 51, the sum of the voltages x and $-y$ is then formed.

The transfer function of the 3rd-order loop filter 28 is given by:

$$T(Z) = \frac{1 - Z^{-1}}{1 - aZ^{-1}} \times \frac{(Z - 3a) + (3a^2 - 1)Z^{-1} + (-a^2)Z^{-2}}{(1 - aZ^{-1})^2} \quad (15)$$

The transfer function T(Z) is written as a product of a first-order transfer function and a second-order transfer function. The first-order transfer function is realized by the section 60 of the filter 28, which section basically comprises the combination of a differentiator and an integrator. The second-order transfer function is realized by the section 70 of the filter 28, which section basically comprises two integrators arranged in series. These two sections 60 and 70 are devices which are known per se in switched-capacitor technology, for which reason the exact operation of filter 28 will not be described in more detail. It is to be noted only that the filter 28 supplies the filtered version of the difference signal $v = x - y$ to the integrator 40. The coefficients in the transfer function are determined by the capacitance ratios of the capacitors. In integrated-circuit technology capacitance ratios can be realized with a high accuracy despite comparatively large tolerance in the capacitances of the individual capacitors.

As stated in the foregoing, the output voltage of the integrator 40 also depends on the capacitance ratio between the capacitor $C_1$ and the capacitors $C_2$, $C_3$ and $C_4$. This capacitance ratio may now be selected in such a way that for a specific input voltage the output voltage of the amplifier 41 is limited by the power-supply voltage, so that the integrator itself acts as a limiter for the input signal.

A further advantage of an at least third-order loop filter in a 1-bit encoding device for analog-to-digital conversion is that the annoying effects occurring in the first-order loop filter as a result of the d.c. offset on the input of the encoding device do not occur.

Figure 19:
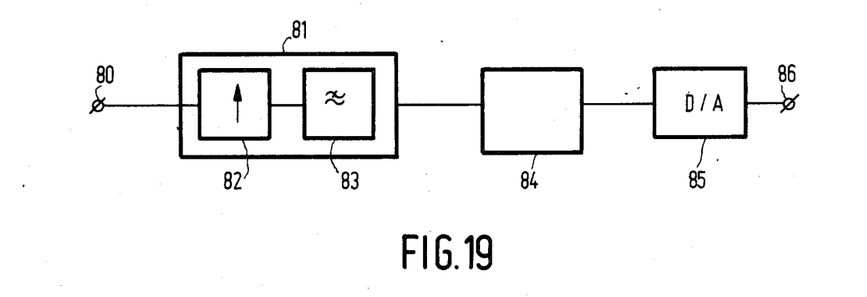
FIG. 19 shows the basic diagram of a digital-to-analog converter comprising a 1-bit encoding device.

FIG. 19 shows the basic diagram of a digital-to-analog converter in which an encoding device in accordance with the invention may be used. For example, a 16-bit pulse code-modulated signal with a sampling frequency $F_2$ is applied to the input 80 and is converted into, for example, a 24-bit signal with a sampling frequency 128. $F_s$ by means of an interpolating filter 81 comprising a up-sampler 82 and a low-pass filter 83. Subsequently, this signal is converted into, for example, a 1-bit encoded signal having a sampling frequency of 128. $F_s$ by means of an encoding device 84. By means of the actual 1-bit digital-to-analog converter 85 this signal is converted into an analog signal, which appears on the output 86.

The basic diagram of an encoding device in accordance with the invention for use in the device shown in FIG. 19 is identical to that shown in FIG. 2. Now the encoding device does not convert a discrete-time analog signal into a 1-bit signal but it converts a multi-bit digital-signal into an 1-bit signal. The quantizer 14, the loop filter 28, the limiter 23 and the summing circuits 10 and 8 are now of the digital type. However, for the operation of the encoding device it is irrelevant whether an analog or a digital signal is converted, so that the stability requirements for the encoding device remain the same.

Figure 20:
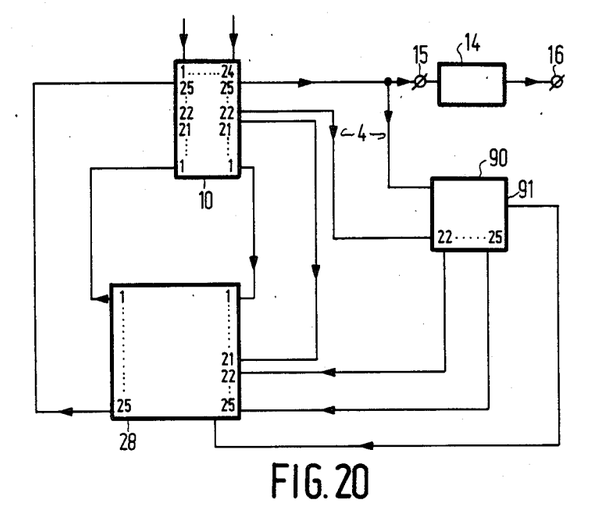
FIG. 20 shows a 1-bit encoding device intended for use in the converter shown in FIG. 19.

FIG. 20 shows a practical embodiment of such a device. The n-bit, for example 24-bit, input signal is applied to the digital summing circuit 10, in which it is added to the m-bit, for example 25-bit, output signal of the loop filter 28. The most significant bit of the k+1-bit, for example 25-bit, output signal of the summing circuit 10, i.e. the 25th or sign bit, is applied to the quantizer 14 which comprises a digital comparator. For a positive value of this sign bit the output sgnal of the quantizer 14 is +E and for a negative value it is −E, corresponding to for example a logic "1" and a logic "0" respectively. In the present embodiment the signal level +E expressed in the number of bits of the 25-bit input signal corresponds to the binary number 000100 . . . 0, of which only the most significant bit but 4 is 1. Expressed as this number of bits, the signal level −E corresponds to the binary number 111 0000 . . . 0. Therefore, for calculating the quantization error caused by the quantizer 14, only the four most significant bits 22 to 25 are required. These bits are applied to a device 90 which supplies the signal representing the difference between these four bits and the output signal level ±E of the quantizer 14 expressed in the 4 most significant bits to the inputs 22–25 of the loop filter 28. The 21 least significant bits of the quantization error signal are applied directly from the output of the summing circuit 10 to the relevant inputs 1–21 of the loop filter 28. The total input signal of the loop filter 28 then represents the quantization error, i.e. the difference between the input signal and the output signal of the quantizer 14 expressed in the number of bits of the input signal.

The device 90 also limits the maximum value of the input signal of the loop filter in order to maintain the encoding device stable. The signals $a_o$, $b_o$, $c_o$ and $d_o$ appearing on the outputs 22-25 of the device 90 then comply with, for example, the following relationships:

$$a_o = \overline{b \cdot c + \overline{b} \cdot d + \overline{c} \cdot d + \overline{d} \cdot c + a} \tag{16}$$

$$b_o = \overline{a \cdot \overline{b} \cdot \overline{c} \cdot \overline{d} + a \cdot \overline{b} \cdot \overline{c} \cdot \overline{d} + a \cdot b \cdot \overline{c} \cdot \overline{d}}$$

$$d_o = c_o = \overline{c \cdot \overline{d} + b \cdot \overline{d} + a \cdot \overline{d} + a \cdot b \cdot c}$$

where a, b, c and d are the output signals on the outputs 22-25 of the summing circuit 24.

Further the device 90 produces a reset sgnal R on an input 91 for resetting the least significant bits 1-21 on the input of the loop filter 28 if the device 90 limits the output signal $d_o c_o b_o a_o$. This reset signal R complies with the following relationship:

$$R = b \cdot c - d \cdot + \overline{b} \cdot \overline{c} \cdot d + \overline{a} \cdot \overline{c} \cdot d \tag{17}$$

The above logic expressions can be realized simply by means of standard logic elements.

Figure 21:
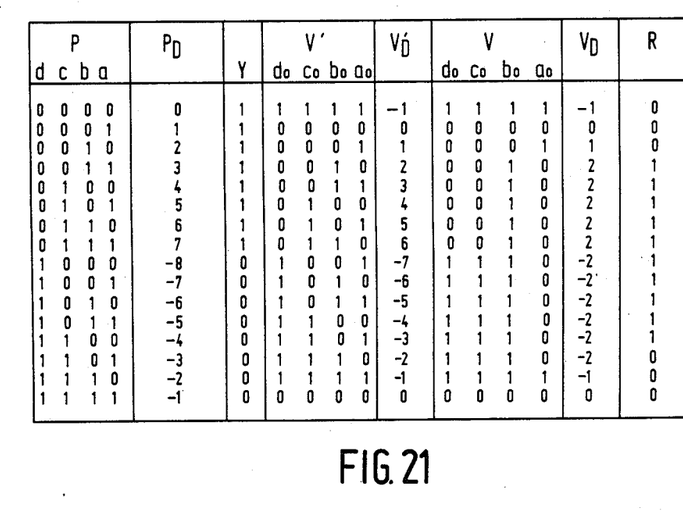
FIG. 21 is a truth table for the device 90 in encoding device of FIG. 20.

FIG. 21 gives a truth table which in this order specifies: the input signal P=dcba of the device 90, the decimal value $P_D$ of this signal P, the output signal y=d of the quantizer 14, the non-limited output signal V' of the device 90, the decimal value $V'_D$ of this signal V', the limited output signal V of the device 90, the decimal value $V_D$ of this signal V and the reset signal R.

From this table it is evident that in the present embodiment the input signal of the loop filter 28 is limited to a value 00100 . . . 0 for positive input signals and to a value 11100 . . . 0 for negative input signals.

Figure 22:
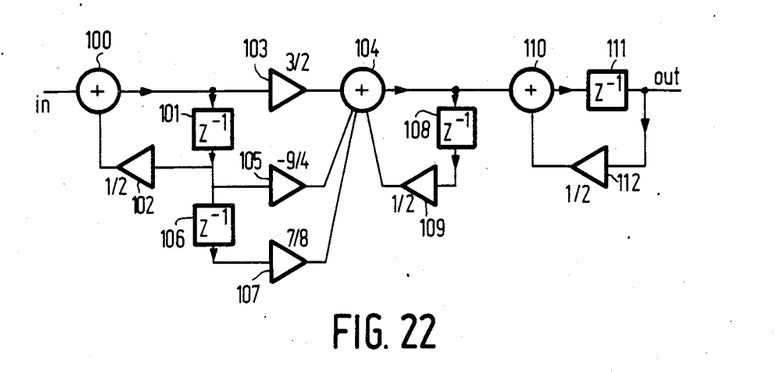
FIG. 22 is a block diagram of a 3rd-order loop filter of an encoding device as shown in FIG. 20.

FIG. 22 shows the circuit diagram of an example of a 3rd-order filter 28 whose transfer function is given by $$H(Z) = 1 - \frac{(Z-1)^3}{(Z-\frac{1}{2})^3} \tag{18}$$

which may be written as:

$$H(Z) = \frac{Z^{-1}(\frac{7}{8}Z^{-2} - 9/4\, Z^{-1} + 3/2}{(1 - \frac{1}{2}Z^{-1})^3} \tag{19}$$

The filter comprises summing circuits, multipliers and delay means $Z^{-1}$. The input signal V is applied to a first input of a first summing circuit 100, a loop comprising a delay means 101 and a multiplier 102 with a coefficient ½ being arranged between the output and the second input, to form the first factor $(1-\frac{1}{2}Z^{-1})$ in the denominator of the transfer function. The output signal of the summing circuit 100 is further applied to a first input of a second summing circuit 104 via a multiplier 103 with a coefficient 3/2, to a second input via a delay means 101 followed by a multiplier 105 with a coefficient −9/4, and to a third input of the summing circuit 104 via delay means 101 and 106 followed by a multiplier 107 with a coefficient ⅞. The elements 101, 103-107 produce the factor ⅞$Z^{-2}$−9/4$Z^{-1}$+3/2. A second feedback loop comprising a delay means 108 and a multiplier 109 with a coefficient ½ is arranged between the output and a fourth input of this summing circuit 104 to generate the second factor $1-\frac{1}{2}Z^{-1}$. The output signal of the summing circuit 104 is applied to a first input of a third summing circuit 110, a third feedback loop comprising a delay means 111 followed by a multiplier 112 with a coefficient ½ being arranged between the output and a second input to generate the third factor $1-\frac{1}{2}Z^{-1}$. The output signal of the summing circuit 110 is applied to the output of the filter via a delay means 111, whichd adds a factor $Z^{-1}$ to the transfer function, on which output the output signal H(Z)V appears, H(Z) being given by equation (19).

Figure 23:
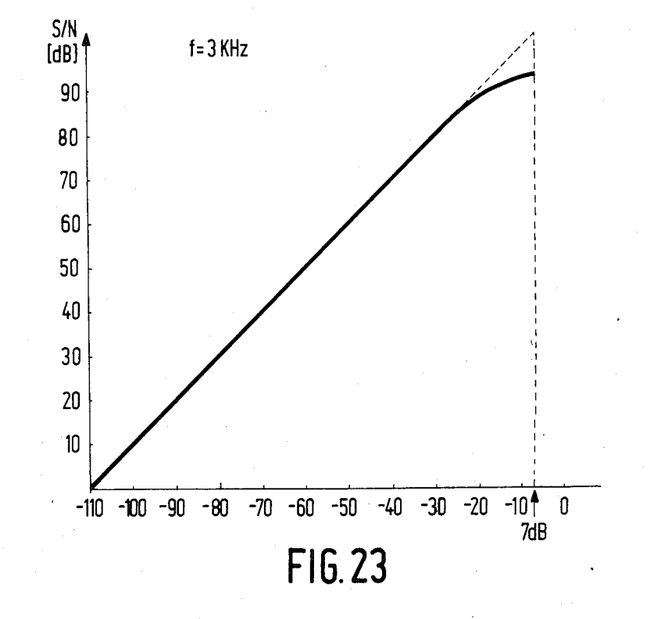
FIG. 23 represents the signal-to-noise ratio for a 1-bit encoding device as shown in FIG. 19 and comprising a third-order loop filter.

In FIG. 23 the measured signal-to-noise ratio of the encoding device of FIG. 20 comprising a third-order loop filter 28 is plotted as a function of the power of a digitally generated sinewave input signal having a normalized frequency of $5.315 \cdot 10^{-4}$. The 0-dB level corresponds to the maximum attainable output power $E^2/2$ of the encoding device. The maximum output power is Sm=−7 dB. For an input signal level above −7 dB the limiting function of the device 90 becomes operative. The measured noise level for a very small input signal is $N_i = -110.1$ dB, which is well in conformity with the power $N_i = -111.1$ dB computed in conformity with equation (1). It follows from this figure that the dynamic range of the encoding device is Sm/Ni=103 dB. The maximum signal-to-noise ratio measurable by means of the available measuring equipment is $(S/N)_{max}$=94 dB. However, the actual maximum signal-to-noise ratio has much higher value.

The invention is not limited to the embodiments shown. Within the scope of the invention many modifications are conceivable to those skilled in the art. For example, since the loop filter has a transfer function substantially equal to unity for the signal frequencies, the input signal may also be added to the input signal of the filter instead of to the output signal of the filter.

What is claimed is

1. An encoding device comprising a quantizer for converting an input signal into an one-bit encoded signal, which quantizer comprises an input for receiving the input signal and an output for supplying the one-bit encoded signal, and further comprising error-feedback means for feeding back to the quantizer input a quantization-error signal caused by the quantizer, which error-feedback means comprise an at least third-order filter having an input and an output, wherein the transfer function of the filter is given by $$H_n(Z) = 1 - (Z-b)^n/(Z-a)^n$$

where:

n≧3 is the order of the filter b is a constant substantially equal to unity, and a is a constant for which 0<a<b, and in that the device comprises limiting means for limiting the quantization-error signal applied to the input of the filter.

2. An encoding device as claimed in claim 1, wherein for a third-order filter (n=3) the constant a has a value within the interval 0.35<a<b.

3. An encoding device as claimed in claim 2, wherein the value of the constant a is substantially equal to a=0.5.

4. An encoding device as claimed in claim 1, wherein for a fourth-order filter (n=4) the constant a has a value within the interval $0.6<a<b$.

5. An encoding device as claimed in claim 4, wherein the value of the constant a is substantially equal to $a=0.66$.

6. An encoding device as claimed in claim 1, wherein the input signal is a discrete-time amplitude-continuous signal.

7. An encoding device as claimed in claim 6, wherein the device further comprises
- a first summing circuit having a first input for receiving the input signal, a second input for receiving the output signal of the filter, and an output for supplying the sum signal of said two signals to the input of the quantizer,
- a second summing circuit having a first input for receiving the output signal of the quantizer, a second input for receiving the output signal of the first summing circuit, and an output for supplying the difference between these two signals to the input of the filter, and
- limiting means arranged between the output of the first summing circuit and the input of the filter in a first loop comprising the first summing circuit, the second summing circuit and the filter.

8. An encoding device as claimed in claim 7, wherein
in the first loop comprising the first summing circuit, the second summing circuit and the filter a first delay means is arranged between the output of the first summing circuit and the first input of the second summing circuit for delaying the output signal of the first summing circuit by one clock period of the quantizer,
in the second loop comprising the first summing circuit, the quantizer and the filter a second delay means is arranged between the output of the first summing circuit and the second input of the second summing circuit, which second delay means has the same delay as the first delay means,
the first summing circuit has a third input for receiving the output signal of the first summing circuit delayed by one clock period,
in that the first summing circuit has a fourth input for receiving the output signal of the quantizer delayed by one clock period, and
the transfer function of the filter is given by $ZH(Z)^{-1}$.

9. An encoding device as claimed in claim 8, wherein
in the first loop the first delay means comprises a third delay means for delaying the output signal of the first summing circuit by half a clock period between the output of the first summing circuit and the input of the quantizer and a fourth delay means for delaying the output signal of the summing circuit by half a clock period between the input of the quantizer and the first input of the second summing circuit,
in the second loop the second delay means comprises the first delay means and a fifth delay means for delaying the output signal of the quantizer by half a clock period between the output of the quantizer and the second input of the second summing circuit, and
between the output of the third delay means and the third input of the first summing circuit a sixth delay means is arranged for delaying the output signal of the third delay means by half a clock period.

10. An encoding device as claimed in claim 9, wherein the device is constructed by means of switched capacitors, in which device,
the loop comprising the first summing circuit, the third delay means and the sixth delay means forms a switched-capacitor integrator, the signals on the first input, the second input and the fourth input of the first summing circuit being sampled in a first half of a clock period and the output signal of the integrator being applied to an output of the integrator in a second half of a clock period,
the output signal of the quantizer is supplied to the output of the quantizer in a second half of a clock period,
the fourth delay means comprises a first switch for connecting the output of the integrator to a first input of a first in a first clock period,
the fifth delay means comprises a second switch for connecting the output of the quantizer to a second input of the filter in a first clock period, and
the filter is a switched-capacitor filter comprising an input stage which processes the sum of the signals on the first input and the second input of the filter.

11. An encoding device as claimed in claim 1 wherein the input signal is a multi-bit digital signal.

12. An encoding device as claimed in claim 11, the device further comprises
- a first summing circuit having an n-bit first input for receiving an n-bit input signal, an m-bit second input for receiving the m-bit output signal of the filter and a k+1-bit output for supplying the k+1-bit sum signal of these signals,
- means for supplying the most-significant bit of the sum signal to the input of the quantizer,
- means for supplying the k least significant bits to the k+1-bit input of the filter, and
- means for supplying the l most significant bits of the sum signal to an l-bit input of a logic circuit device having an l-bit output for supplying the l-bit difference signal of the l-bit input signal and the quantizer output signal expressed in l bits to the k+1 input of the filter.

13. An analog-to-digital converter, comprising an encoding device as claimed in claim 1.

14. A digital-to-analog converter, comprising an encoding device as claimed in claim 1.

* * * * *